(12) United States Patent
Atmur

(10) Patent No.: US 8,269,756 B2
(45) Date of Patent: Sep. 18, 2012

(54) CONTROLLABLE VOLTAGE DEVICE DRIVERS AND METHODS OF OPERATION THEREFOR

(75) Inventor: Robert J. Atmur, Whittier, CA (US)

(73) Assignee: The Boeing Company, Chicago, IL (US)

( * ) Notice: Subject to any disclaimer, the term of this patent is extended or adjusted under 35 U.S.C. 154(b) by 1482 days.

(21) Appl. No.: 11/763,980

(22) Filed: Jun. 15, 2007

(65) Prior Publication Data

US 2008/0309305 A1     Dec. 18, 2008

(51) Int. Cl.
*G09G 3/28*     (2006.01)
*G09G 5/00*     (2006.01)

(52) U.S. Cl. ........................ 345/211; 323/301
(58) Field of Classification Search ................ None
See application file for complete search history.

(56) References Cited

U.S. PATENT DOCUMENTS

| | | | | |
|---|---|---|---|---|
| 3,829,838 A * | 8/1974 | Lewis et al. | ................ | 345/419 |
| 4,417,199 A * | 11/1983 | Jones | ........................ | 323/319 |
| 4,429,269 A * | 1/1984 | Brown | ........................ | 323/301 |
| 4,661,896 A * | 4/1987 | Kobayashi et al. | ............. | 363/24 |
| 5,227,713 A * | 7/1993 | Bowler et al. | ................... | 322/58 |
| 5,398,041 A * | 3/1995 | Hyatt | ........................ | 345/88 |
| 5,594,323 A * | 1/1997 | Herfurth et al. | ............. | 323/222 |
| 5,754,414 A * | 5/1998 | Hanington | ................. | 363/21.12 |
| 6,653,824 B1 * | 11/2003 | Whitlock | ..................... | 323/344 |
| 6,806,688 B2 * | 10/2004 | Noro et al. | ..................... | 322/20 |
| 6,997,935 B2 * | 2/2006 | Anderson et al. | ............ | 606/169 |
| 2007/0222421 A1 * | 9/2007 | Labuschagne | ................ | 323/255 |

OTHER PUBLICATIONS

Analog Modules, Inc., Pockels Cell Drivers, http://www.analogmodules.com/Catalog/pockels.htm, Mar. 21, 2006.

* cited by examiner

*Primary Examiner* — Joe H Cheng
(74) *Attorney, Agent, or Firm* — Yee & Associates, P.C.

(57) ABSTRACT

Embodiments include controllable voltage device drivers adapted to generate driver output voltages. A device driver includes a direct current (DC) voltage source adapted to receive a voltage level command that indicates a commanded voltage, and to generate a DC transformer input voltage having a voltage level corresponding to the commanded voltage. The device driver also includes a step-up transformer adapted to receive the DC transformer input voltage and to convert the DC transformer input voltage into an alternating current (AC) transformer output voltage. The device driver also includes at least one processing element, adapted to receive one or more control inputs, and to generate an alternating current through a primary transformer winding based on the one or more control inputs. Other embodiments include methods for a controllable voltage device driver to generate a driver output voltage, and optical systems having an electro-optical device and an electro-optical device driver subsystem.

19 Claims, 3 Drawing Sheets

US 8,269,756 B2

CONTROLLABLE VOLTAGE DEVICE DRIVERS AND METHODS OF OPERATION THEREFOR

GOVERNMENT LICENSE RIGHTS

The U.S. Government may have certain rights to some or all of the inventive subject matter of the present application.

TECHNICAL FIELD

Embodiments described herein generally relate to device drivers having controllable driver output voltages, and more particularly to controllable voltage, electro-optical device drivers.

BACKGROUND

In a birefringent crystal, an incident light ray will separate into two rays, which may travel in different directions. The direction in which the light travels is dependent on its polarization. For example, the light will travel in different directions for each of two perpendicular states of polarization. Some types of crystals naturally are birefringent. In other types of crystals, application of sufficiently a high voltage across the crystal induces birefringence. The induction of birefringence in a crystal is referred to as the "electro-optical effect," and a crystal processed to provide the electro-optical effect in an optical system is referred to as an "electro-optical device."

Two fairly common types of electro-optical devices are a Pockels cell and an electro-optical deflector. "Pockels cell" refers to a type of crystal having an angle of refraction that shifts by 90 degrees when a sufficient voltage is applied across the crystal. Accordingly, Pockels cells are particularly adapted to function as optical switches having two states (e.g., "on" and "off"). In contrast to a Pockels cell, an "electro-optical deflector" refers to a type of crystal having an angle of refraction that varies based on the voltage applied across the crystal. In some cases, micro-radian angle changes can be achieved through slight voltage variations. Electro-optical deflectors are particularly adapted to function as light beam steering devices.

In order to produce an electro-optical effect in a Pockels cell or an electro-optical deflector, an optical system includes at least one electro-optical device driver adapted to provide a voltage across the electro-optical device. Traditional electro-optical device drivers are configured differently, depending on whether they are to provide an output voltage to a Pockels cell or to an electro-optical deflector. For example, a Pockels cell driver typically is configured to provide a single-polarity (e.g., positive or negative) output voltage at a pre-determined value, whereas an electro-optical deflector typically is configured to provide a single-polarity output voltage having a value that may be varied. Either way, traditional electro-optical device drivers include capacitive elements within which charge is built up and stored, in order to provide the output voltage. Pulse width modulation (PWM) often is used to build up the charges within the capacitive elements, and the charge may be discharged when it is coupled to the electro-optical device. Voltages sufficient to produce an electro-optical effect typically are relatively high (e.g., in a range of about 500-4000 volts (V) or more).

Although existing electro-optical device drivers provide adequate functionality in many cases, they also suffer from some disadvantages relating to safety, size, frequency limitations, and power consumption. Regarding safety, the retention of energy in the capacitive elements gives rise to certain safety and handling issues. In particular, during handling of a driver, extreme care should be exercised in order to avoid discharging the energy into an unintended load. Regarding size, electro-optical device drivers that provide variable voltages tend to be expensive, relatively large electronics modules. For example, a typical, variable voltage, electro-optical device driver may be implemented as a rack-mounted module having dimensions in a range of about 45-60 centimeters (cm) in width and depth, and about 5-10 cm in height. Regarding frequency limitations, the rate of a PWM input to charge the capacitive elements is limited to avoid output voltage droop. Correspondingly, the rate at which the output voltage may be switched on and off also is limited. Regarding power consumption, existing electro-optical device drivers continue to consume power, even at times when the output voltage is not provided to the load, because these drivers continue to maintain the energy within the capacitive elements during those times. Accordingly, these electro-optical device drivers tend to be relatively inefficient, with regard to power consumption.

For at least these reasons, it is desirable to provide relatively compact and safe electro-optical device drivers, which are adapted to operate at high switching frequencies, and which are energy efficient. Other desirable features and characteristics of embodiments of the inventive subject matter will become apparent from the subsequent detailed description and the appended claims, taken in conjunction with the accompanying drawings and the foregoing technical field and background.

BRIEF DESCRIPTION OF THE DRAWINGS

Various embodiments will hereinafter be described in conjunction with the following drawing figures, wherein like numerals denote like elements.

DETAILED DESCRIPTION

Embodiments of the inventive subject matter include optical systems, controllable voltage device drivers, electro-optical device drivers, and methods for operating controllable voltage device drivers. The following detailed description is merely exemplary in nature and is not intended to limit the described embodiments or the application and uses of the described embodiments. Furthermore, there is no intention to be bound by any expressed or implied theory presented in the preceding technical field, background or the following detailed description.

Figure 1:
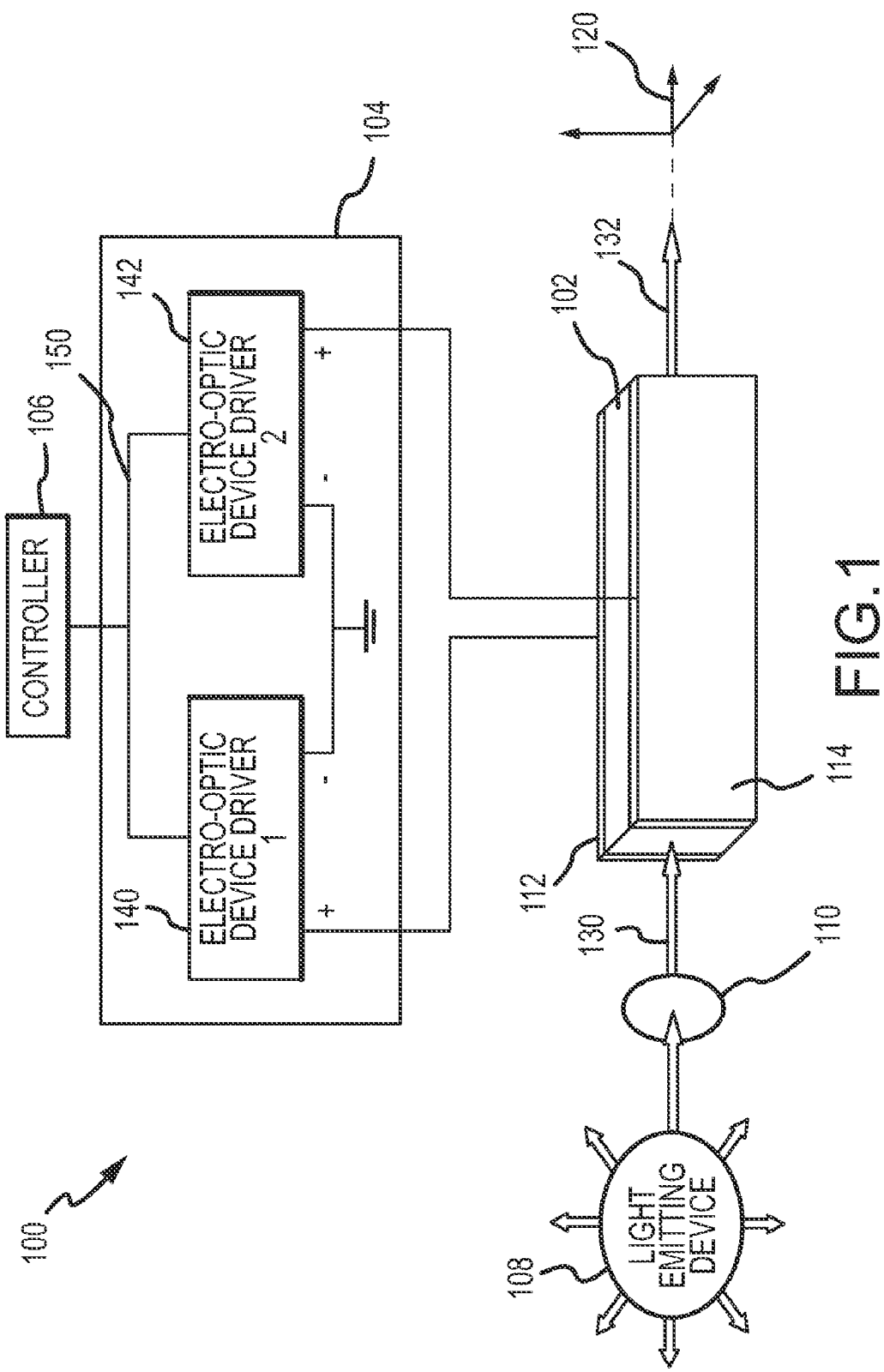
FIG. 1 illustrates a simplified block diagram of an optical system, in accordance with an example embodiment of the inventive subject matter.

FIG. 1 illustrates a simplified diagram of an optical system 100, in accordance with an example embodiment of the inventive subject matter. The optical system 100 depicted in FIG. 1 may be used, for example, as a light beam modulator. Optical system 100 includes at least one electro-optical device 102, electro-optical device driver subsystem 104, and controller 106, in an embodiment. Optical system 100 also includes at least one light emitting device 108, polarizer 110, and first and second electrodes 112, 114. Light emitting device 108, polarizer 110, and electro-optical device 102 are oriented, with respect to each other, along a light propagation axis 120. In general, the light being affected by optical system 100 travels along the light propagation axis 120 in a direction indicated generally by arrows 130, 132.

Light emitting device 108 may include, for example, one or more light sources capable of producing unpolarized and/or partially-polarized light. For example, light emitting device 108 may include one or more light emitting diodes (e.g., a super luminescent diode, inorganic or organic light emitting diode), arc lamps, field emission displays, cathode ray tubes, electroluminescent devices, incandescent lamps, vertical cavity surface emitting lasers, and/or other light sources.

Light produced by light emitting device 108 is received by polarizer 110, which is adapted to produce polarized light 130. Polarizer 110 may include, for example, one or more crystalline polarizers (e.g., quartz wedges), liquid crystal polarizers or other types of polarizers.

Polarized light 130 is incident on a first side of electro-optical device 102. Electro-optical device 102 may include, for example, a Pockels cell or an electro-optical deflector, in various embodiments. In other embodiments, electro-optical device 102 may include a different type of electro-optical crystal. Electro-optical device 102 may include, for example but not by way of limitation, at least one crystal selected from a group of crystals that includes lithium niobate ($LiNbO_3$), lithium tantalate ($LiTaO_3$); potassium dihydrogen phosphate ($KH_2PO_4$), ammonium dihydrogen phosphate ($NH_4H_2PO_4$), potassium dideuterium phosphate ($KD_2PO_4$), barium sodium niobate ($Ba_2NaNb_5O_{15}$), and cadmium telluride (CdTe). Selection of a crystal may depend on the desired bandwidth, spectral range, half-wave voltage, and refraction index characteristics, among other things.

The angle of refraction of electro-optical device 102 is dependent on a voltage applied across electro-optical device 102. Depending on the voltage, electro-optical device 102 may be in a transmissive state (e.g., some or all of polarized light 130 is transmitted through electro-optical device 102) or in a non-transmissive state (e.g., polarized light 130 is not transmitted through electro-optical device 102). When electro-optical device 102 is in a transmissive state, electro-optical device 102 produces transmitted light 132. The transmitted light 132 may or may not be modulated in amplitude, frequency, and/or phase, with respect to polarized light 130.

First and second electrodes 112, 114 function as parallel plates, which are adapted to provide a voltage across electro-optical device 102 in order to affect the angle of refraction of electro-optical device 102. First and second electrodes 112, 114 may include, for example, metal electrodes, film electrodes, prism electrodes, and/or pixel electrodes, to name a few. In the illustrated embodiment, first and second electrodes 112, 114 are oriented, with respect to electro-optical device 102, to generate a voltage that is perpendicular to light propagation axis 120. In this orientation, referred to herein as a transverse orientation, first and second electrodes 112, 114 may be substantially opaque (e.g., metal electrodes). In another embodiment, the electrodes may be oriented to generate a voltage that is parallel to light propagation axis 120. In this second orientation, referred to herein as a longitudinal orientation, the electrodes may be substantially transparent or may include central apertures.

Electro-optical device driver subsystem 104 is adapted to generate an output voltage, which is applied across electro-optical device 102 via first and second electrodes 112, 114. As will be described in more detail later, electro-optical device driver subsystem 104 generates the output voltage based on control inputs received from controller 106 over control line 150. These control inputs may affect the timing, duration, polarity, and/or value of the output voltage generated by electro-optical device driver subsystem 104.

In an embodiment, electro-optical device driver subsystem 104 includes two device drivers 140, 142. In an embodiment, each device driver 140, 142 includes a controllable voltage, electro-optical device driver. Each device driver 140, 142 may include an electronics module housed on a printed circuit board, in an embodiment. In alternate embodiments, electro-optical device driver subsystem 104 may include as few as one electro-optical device driver or more than two device drivers 140, 142. In still another alternate embodiment, electro-optical device driver subsystem 104 may include a single device driver that includes the hardware and functionality of multiple device drivers 140, 142, and/or that is housed on a single printed circuit board.

Each device driver 140, 142 is adapted to generate an output voltage across a first output terminal and a second output terminal, in an embodiment. In the configuration illustrated in FIG. 1, the device drivers 140, 142 are connected in parallel across electro-optical device 102. Accordingly, a first output terminal of a first device driver 140 is electrically coupled to first electrode 112, and a second output terminal of a second device driver 142 is electrically coupled to a second electrode 114. In addition, a second output terminal of the first device driver 140 and a first output terminal of the second device driver 142 are tied together and to ground. In alternate embodiments, device drivers 140, 142 may be differently connected (e.g., serially connected), a single device driver may be included within an electro-optical device driver subsystem, or more than two device drivers may be included within an electro-optical device driver subsystem.

In an embodiment, each device driver 140, 142 is configurable as a "positive voltage driver" or a "negative voltage driver." When configured as a positive voltage driver, a device driver 140 or 142 may generate an output voltage upon receipt of a control input specifying a positive output voltage, and may refrain from generating an output voltage upon receipt of a control input specifying a negative output voltage. When configured as a negative voltage driver, a device driver 140 or 142 may generate an output voltage upon receipt of a control input specifying a negative output voltage, and may refrain from generating an output voltage upon receipt of a control input specifying a positive output voltage. In an embodiment, device driver 140 is configured as a positive device driver, and device driver 142 is configured as a negative device driver. Accordingly, electro-optical device driver subsystem 104 is adapted to generate a positive voltage or a negative voltage across electro-optical device 102, depending on which one of device drivers 140 or 142 is generating an output voltage at the time.

In an embodiment, each device driver 140, 142 is adapted to generate an output voltage in a range from 0 to about 4000 V, and accordingly the electro-optical device driver subsystem 104 is adapted to generate voltages, across electro-optical device 102 in a range of about −4000 to about +4000 V (i.e., about an 8000 volt swing). In other embodiments, either or both device drivers 140, 142 may be adapted to generate an output voltage having a larger or smaller voltage and/or a larger or smaller voltage range. In still other embodiments, multiple device drivers may be connected in series or in other configurations, such that the electro-optical device driver subsystem 104 is adapted to generate positive or negative voltages having magnitudes that are greater than the magnitude of the output voltage generated by a single device driver. For example, when two device drivers are connected in series, and each generates an output voltage of about 4000 V, the electro-optical device driver subsystem may generate an output voltage having a magnitude of about 8000 V.

In an embodiment, each device driver 140, 142 is configurable to function as a Pockels cell driver or an electro-optical deflector driver. When configured to function as a Pockels cell driver, device driver 140, 142 may receive a first control input corresponding to an output voltage level. Upon receipt of a subsequent control input indicating when the output voltage is to be generated, the device driver 140, 142 may then generate the output voltage at the commanded voltage level. The device driver 140, 142 may generate the output voltage for a particular duration or until the device driver 140, 142 receives a subsequent control input indicating that the output voltage should be turned off. In contrast, when configured to function as an electro-optical deflector driver, device driver 140, 142 may generate an output voltage promptly, in response to receipt of a control input corresponding to the output voltage level, in an embodiment.

Configuration of a device driver 140, 142 as a positive device driver or a negative device driver, and/or as a Pockels cell driver or an electro-optical deflector driver may be established in hardware, firmware or software, in various embodiments. The description below discusses configuring a device driver in hardware (e.g., using configuration circuitry, such as jumpers). The inventive subject matter is intended to include embodiments in which the configurations alternatively are made in firmware or software.

When a voltage applied across electro-optical device 102 places electro-optical device 102 in a transmissive state, polarized light 130 incident on a first side of electro-optical device 102 may be transmitted through electro-optical device 102 and may exit the electro-optical device 102 through a second side of electro-optical device 102. Depending on the applied voltage, the direction in which the crystal has been cut, the crystal orientation, the crystal material, and/or other factors, the transmitted light 132 through electro-optical device 102 may be substantially un-modulated or modulated in amplitude, frequency, and/or phase, with respect to polarized light 130, as mentioned previously. Transmitted light 132 may be further processed, transmitted, and/or consumed by other elements of the optical system 100 or other, external systems (not illustrated). Transmitted light 132 may convey binary information (e.g., switching states of "on" or "off") and/or may convey other digital information (e.g., communications information).

Although optical system 100 has been described as a light beam modulator, embodiments of the inventive subject matter also may be implemented in other types of optical systems, including but not limited to Q-switches, beam steering systems, beam deflectors, and mode-lockers, to name a few. Optical system 100 may include one or more additional or different system elements, including but not limited to one or more monochromators, optical filters, reflectors, and/or analyzers, to name a few. In addition, although only one electro-optical device 102 is illustrated in FIG. 1, multiple electro-optical devices may be oriented in series along light propagation axis 120, particularly when electrodes 112, 114 have a transverse orientation, as illustrated. In such systems, multiple electrode pairs may be included in the system to apply voltages to the multiple electro-optical devices. These and other modifications and variations are intended to be included in the scope of the inventive subject matter.

Figure 2:
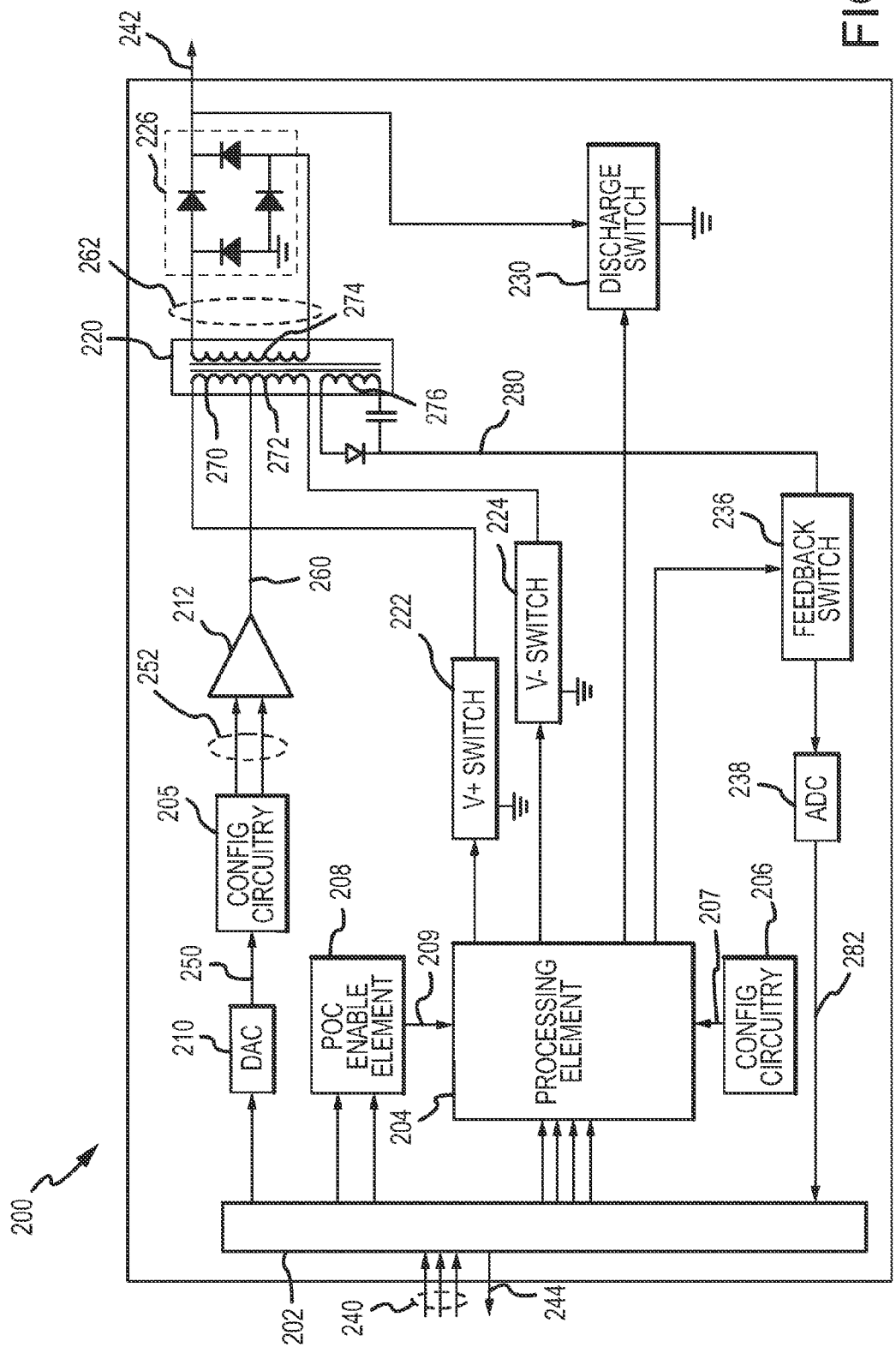
FIG. 2 illustrates a simplified schematic diagram of a controllable voltage device driver, in accordance with an example embodiment.

FIG. 2 illustrates a simplified schematic diagram of a controllable voltage device driver 200, in accordance with an example embodiment. In an embodiment, device driver 200 is adapted to generate relatively high output voltages (e.g., up to or exceeding magnitudes of 4000 V) at relatively low output currents (e.g., at or below 20 milliamps). Accordingly, device driver 200 is adapted to drive devices that require relatively high voltages at relatively low currents, such as electro-optical devices (e.g., electro-optical device 102, FIG. 1). In other embodiments, device driver 200 may be used to drive devices other than electro-optical devices.

Device driver 200 is adapted to receive and evaluate input signals 240 and, in response, to generate driver output voltages 242. Device driver 200 includes multiple components, which may be housed on one or more printed circuit boards. In a particular embodiment, device driver 200 may be housed on a single printed circuit board. In other embodiments, device driver 200 may be housed on multiple printed circuit boards, or multiple device drivers may be housed on a single printed circuit board. In the latter case, some of the functionality of the multiple device driver modules may be performed by common electronics (e.g., a common processor).

Device driver 200 includes at least one connector 202, at least one processing element 204, first and second configuration circuitry 205, 206 ("config circuitry"), Pockels cell (POC) enable element 208, digital-to-analog converter 210 (DAC), amplifier 212, transformer 220, one or more transformer switches 222, 224 ("V+ switch" and "V− switch"), rectifier 226, discharge switch 230, feedback switch 236, and analog-to-digital converter 238 (ADC), in an embodiment. In addition, device driver 200 may include bias power circuitry (not illustrated) adapted to receive one or more input direct current (DC) voltages (e.g., 24 V via connector 202) and to generate one or more on-chip DC bias voltages (e.g., 5 V, 18 V, and or other voltages) for powering various components of device driver 200.

For simplicity, various components of device driver 200 may be referred to singularly, below, although it is to be understood that device driver 200 may include multiple ones of certain components. In addition, device driver 200 may include additional or different components and/or circuitry adapted to produce substantially similar results, in embodiments other than those specifically described below. These variations are intended to be included within the scope of the inventive subject matter.

In various embodiments, device driver 200 is a configurable device driver. Because the configuration of device driver 200 may affect the way that device driver 200 operates, various components associated with configuring device driver 200 will first be discussed. In an embodiment, device driver 200 may be configured to operate in Pockel's cell (POC) mode or in electro-optical deflector (EOD) mode. Briefly, when configured in POC mode, device driver 200 is adapted to receive and process voltage level commands, enable commands, and disable commands, each of with is described in more detail later. Upon receipt of a voltage level command, device driver 200 is adapted to prepare for generating a driver output voltage 242. However, device driver 200 may refrain from generating the driver output voltage 242 until it receives an enable command. In POC mode, device driver 200 is adapted to turn off (e.g., to discharge) the driver output voltage 242 upon receipt of a disable command. Conversely, when configured in EOD mode, device driver 200 is adapted to generate a driver output voltage 242 promptly upon receipt of a voltage level command, and enable and disable commands may be disregarded.

In addition or alternatively, device driver 200 may be configured to operate in a positive voltage mode or a negative voltage mode. When configured in a positive voltage mode, device driver 200 may generate a driver output voltage 242 when a received voltage polarity input (e.g., as part of a voltage level command) indicates that a positive output voltage has been commanded. Conversely, when configured in a negative voltage mode, device driver 200 may generate a driver output voltage 242 when a received voltage polarity input indicates that a negative output voltage has been commanded. Otherwise, device driver 200 may refrain from generating the driver output voltage 242.

In an embodiment, device driver 200 includes first configuration circuitry 205 and second configuration circuitry 206. First configuration circuitry 205 is adapted to enable device driver 200 to be configured in a positive voltage mode or a negative voltage mode. First configuration circuitry 205 is relevant to the operation of amplifier 212, as will be described in more detail later. Second configuration circuitry 206 is adapted to enable device driver 200 to be configured in POC mode or EOD mode. In addition, second configuration circuitry 206 is adapted to enable device driver 200 to be configured in a positive voltage mode or a negative voltage mode. Second configuration circuitry 206 generates configuration signals 207, in an embodiment, which indicate whether device driver 200 is configured in POC or EOD mode and/or positive or negative voltage mode. The configuration is relevant to the operation of processing element 204, as will also be described later. In an embodiment, first configuration circuitry 205 and/or second configuration circuitry 206 may be implemented as sets of jumpers, which are adapted to configure device driver 200 in POC or EOD mode and/or positive voltage or negative voltage mode based on the connections made across the jumpers. In other embodiments, configuration of device driver 200 may be hardwired, defined in embedded software, and/or conveyed via signals provided by one or more external sources. Now that configuration of device driver 200 has been explained, other components of device driver 200 will now be described.

Connector 202 is adapted to receive various input signals 240 from other system components (e.g., controller 106, FIG. 1). Connector 210 may be adapted to provide an RS-232 and/or an RS-422 interface, in an embodiment. Connector 210 may include, for example, one or more multiple-pin connectors adapted to interface with a serial bus, such as a serial peripheral interface bus, and/or one or more differential signaling pairs. In an embodiment, connector 210 is adapted to receive input signals 240 in the form of at least a clock signal, a serial input data signal, and a differential pair enable/disable signal. Input signals 240 also may include one or more chip select signals and/or other signals, in various embodiments. Connector 210 may be further adapted to generate one or more output signals 244 (e.g., serial output data signals), in an embodiment. As will be described in more detail later, output signals may include feedback information, among other things.

In an embodiment, connector 202 conveys input signals to processing element 204, to POC enable element 208, and to DAC 210. Input signals 240 may include, for example, various control inputs represented in a frame format and/or other formats (e.g., differential signals). In an embodiment, the control inputs may include voltage level commands, enable commands, and/or disable commands, which are generated by other system components (e.g., controller 106, FIG. 1). A "voltage level command," as that term is used herein, includes a control input that includes a digital indication of a voltage level that the electro-optical device should generate (referred to herein as a "commanded voltage level"). A voltage level command also may include an indication of a voltage polarity (i.e., positive or negative), in an embodiment, although a voltage polarity input alternatively may be received as a separate command and/or as a different input signal. In an embodiment, the commanded voltage level corresponds to a driver output voltage 242. In other embodiments, the commanded voltage level may correspond to an intermediate voltage, such as an output voltage of amplifier 212, or some other voltage having a known relationship to the driver output voltage 242. Connector 202 provides voltage level commands to processing element 204 and to DAC 210, in an embodiment.

An "enable command," as that term is used herein, includes a control input that indicates to the device driver 200 that the driver output voltage 242 should be generated. Conversely, a "disable command," as that term is used herein, includes a control input that indicates to the device driver 200 that the driver output voltage 242 should be discharged or otherwise turned off. Enable and disable command inputs are received by connector 202 in the form of differential input signals, in an embodiment. Connector 202 provides input signals associated with enable and disable commands to POC enable element 208, in an embodiment. Based on the difference between the differential input signals, POC enable element 208 generates a POC enable/disable signal 209, which is received by processing element 204. Evaluation of enable/disable signal 209 by processing element 204 will be discussed in more detail later.

DAC 210, first configuration circuitry 205, and amplifier 212 together form a controllable, direct current (DC) voltage source, which is adapted to generate a relatively low voltage (e.g., in a range of 0-18 volts) as a function of a received voltage level command, in an embodiment. In other embodiments, other combinations of circuit components may form a transformer input voltage source.

DAC 210 is adapted to receive a voltage level command, and to convert a digital representation of the commanded voltage level into a DC voltage signal 250. In an embodiment, the voltage level specified in the voltage level command is represented with up to 12 bits of resolution, although the voltage level may be represented with more or fewer than 12 bits, in other embodiments. The voltage polarity may be represented by as few as one bit, in an embodiment.

First configuration circuitry 205 is electrically coupled to DAC 210, and is adapted to receive voltage signal 250 and to provide differential input signals 252 to amplifier 212, which have a polarity that depends on whether the device driver 200 is configured in positive voltage mode or in negative voltage mode. When voltage signal 250 is a positive voltage, and when device driver 200 is configured in a positive voltage mode, then first configuration circuitry 205 generates differential input signals 252 that cause amplifier 212 to generate a transformer input voltage 260. Alternatively, when voltage signal 250 is a negative voltage, and when device driver 200 is configured in a negative voltage mode, then first configuration circuitry 205 generates differential input signals 252 that cause amplifier 212 to generate a transformer input voltage 260. Otherwise, first configuration circuitry 205 may generate differential input signals 252 that cause amplifier 212 to generate a negligible transformer input voltage 260.

In an embodiment, amplifier 260 includes an operational amplifier adapted to receive differential input signals 252, and to generate transformer input voltage 260 in accordance with the differential input signals 252. Amplifier 260 may include a negative feedback element (not illustrated) and/or other associated circuitry, in various embodiments. In an embodiment, amplifier 260 has a relatively low impedance, and is adapted precisely to generate transformer input voltage 260. Amplifier 260 is electrically coupled to transformer 220.

Transformer 220 may be, for example, a step-up transformer, which is adapted to receive transformer input voltage 260, and to convert transformer input voltage 260 into an alternating current (AC) transformer output voltage 262 having a relatively high amplitude (e.g., up to about 4000 V, in an embodiment), when compared with the transformer input voltage 260. In an embodiment, a step up ratio may be in a range of about 1:10 to about 1:200, although transformer 220 may have smaller or larger step up ratios in other embodiments. In an embodiment, transformer 220 includes a primary winding and a secondary winding 274, where the primary winding includes two winding segments 270, 272 that are coupled at a central tap. Each terminal of the primary winding is electrically coupled to one of transformer switches 222, 224. In an embodiment, the states of transformer switches 222, 224 are alternated, by processing element 204, to generate sequentially alternating magnetizing currents through the primary winding segments 270, 272. The alternating magnetizing currents through primary winding segments 270, 272 produces an alternating magnetic flux in the transformer core, and correspondingly produces an AC transformer output voltage 262 across secondary winding 274. Accordingly, transformer 220 is adapted to receive a DC transformer input voltage 260 at the central tap of the primary winding and to generate the AC transformer output signal 262 across the secondary winding 274. Transformer 220 represents an inductive element in device driver 200, which produces a relatively high-voltage output signal. In other embodiments, transformer 220 may be replaced with other types of inductive or magnetic elements to produce substantially the same results.

In an embodiment, transformer switches 222, 224 include drivers and field effect transistors (FETs), although other types of switching components could be used in other embodiments. When a transformer switch 222, 224 is in an open state, current will not flow through the corresponding primary winding 270, 272 to which the transformer switch 222, 224 is coupled. Conversely, when a transformer switch is in a closed state, current will flow through the corresponding primary winding 270, 272. In an embodiment, either one, but not both, of transformer switches 222, 224 are open at any given time, and accordingly current may be generated in one or the other of primary windings 270, 272. The states of transformer switches 222, 224 may be controlled by processing element 204. Accordingly, processing element 204 is adapted to enable current to flow in a winding of the one or more primary windings 270, 272 by controlling the states of transformer switches 222, 224. In an embodiment, as will be described in more detail later, processing element 204 switches the states of transformer switches 222, 224 at a frequency that corresponds to a frequency of the transformer output voltage 262. Control of transformer switches 222, 224 will be discussed in more detail later.

Rectifier 226 is adapted to rectify the transformer output signal 262, and to generate a rectified driver output voltage 242. In an embodiment, rectifier 226 includes a set of diodes, configured in a parallel/series arrangement as illustrated in FIG. 2. In other embodiments, rectifier 226 may be provided using alternate circuitry. At certain times, as will be described in more detail later, driver output voltage 242 may be discharged to ground via discharge switch 230. In an embodiment, discharge switch 230 includes a driver and an insulating gate bipolar transistor (IGBT), although other types of discharging components could be used in other embodiments. In an embodiment, the transistor may be rated to voltages up to about 4000 V, although transistors having higher or lower ratings alternatively could be used. When discharge switch 230 is in an open state, driver output voltage 242 is not discharged, and when discharge switch 230 is in a closed state, driver output voltage 242 is discharged. As with transformer switches 222, 224, the state of discharge switch 230 may be controlled by processing element 204, and its operation will be discussed in more detail later.

In an embodiment, transformer 220 may also include a feedback winding 276 and associated circuitry, which may generate a feedback signal 280. When feedback switch 236 is in a closed state, the feedback signal 280 may be provided to ADC 238, which may in turn convert the feedback signal 280 into a digital signal 282. In an embodiment, feedback switch 236 includes a FET, although other types of switching components could be used in other embodiments. The digital signal 282 generated by ADC 238 may be provided to connector 202, which may generate an output signal 244 in response. The output signal 244 may be processed by other system components (e.g., controller 106, FIG. 1), which may adjust operations based on the output feedback signal 244. As with transformer switches 222, 224 and discharge switch 230, the state of feedback switch 236 may be controlled by processing element 204.

Processing element 204 will now be described in more detail. Essentially, processing element 204 is adapted to process input signals 240, and either to enable device driver 200 to generate a driver output voltage 242 or to disable device driver 200 from generating a driver output voltage 242. In an embodiment, processing element 204 may include one or more general purpose or special purpose microprocessors, application specific integrated circuits, and/or other components adapted to perform the processing discussed herein.

As mentioned previously, processing element 204 may receive control inputs via connector 202 and via POC enable element 208. These control inputs may include, for example, voltage level commands, voltage polarity inputs, enable commands, and disable commands, to name a few. In an embodiment, processing element 204 may evaluate the commands and inputs in conjunction with configuration signals, which are provided by second configuration circuitry 206. Second configuration circuitry 206 may be configured, in an embodiment, to configure device driver 200 in POC mode or in EOD mode, and/or to generate a driver output voltage upon receipt of a voltage level command corresponding to a positive or a negative polarity output voltage 242. Based on the evaluation, processing element 204 may control the states of transformer switches 222, 224, discharge switch 230, and/or feedback switch 236, as will be described in more detail in conjunction with FIG. 3. By selectively controlling the states of switches 222, 224, and 230, processing element 204 is adapted to cause device driver 200 to generate a driver output voltage 242 (e.g., by alternatively opening and closing V+ switch 222 and V− switch 224) or a grounded output (e.g., by closing discharge switch 230 to discharge the output of rectifier 226 to ground). In addition, processing element 204 is adapted to cause device driver 200 to generate a voltage feedback signal 244 or to refrain from generating the voltage feedback signal 244 (e.g., by closing or opening, respectively, feedback switch 236).

Figure 3:
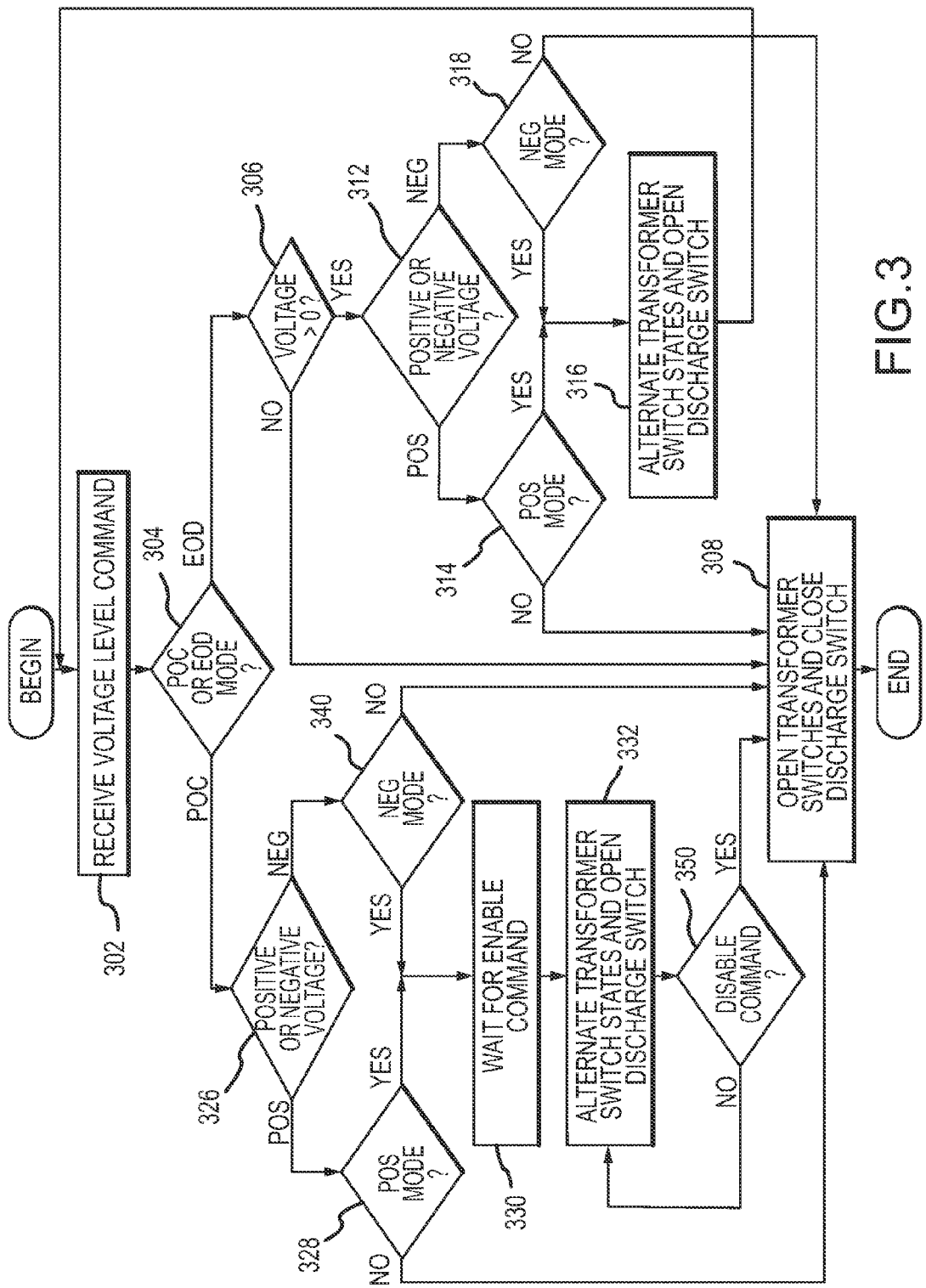
FIG. 3 illustrates a flowchart of a method of operation of controllable voltage device driver processing element, in accordance with an example embodiment.

Input signal evaluation and switch control processes that may be performed by processing element 204 are described in conjunction with FIG. 3, which illustrates a flowchart of a method of operation of a device driver processing element 204, in accordance with an example embodiment. The method may begin, in block 302, when the processing element receives a voltage level command, although the method alternatively may begin at other points in the process. In response to receiving a voltage level command, a determination may be made, in block 304, whether the device driver is configured in POC mode or in EOD mode. This determination may be made, in an embodiment, by the processing element evaluating configuration signals received from configuration circuitry (e.g., configuration signals 207 from second configuration circuitry 206, FIG. 2).

When a determination is made that the device driver is configured in EOD mode, then in block 306, a determination may be made whether a magnitude of the commanded voltage level is greater than zero. When the magnitude of the commanded voltage level is not greater than zero (i.e., the commanded voltage level equals zero), then the processing element may cause the transformer switches (e.g., V+ switch 222 and V− switch 224, FIG. 2) to open, and may also cause the discharge switch (e.g., discharge switch 230, FIG. 2) to close, in block 308, if those switches are not already in those states. These switch controls may substantially eliminate current flow through either primary winding of the transistor (e.g., primary winding segments 270, 272, FIG. 2), which may eliminate production of magnetic flux in the transformer core. Accordingly, current through the secondary winding (e.g., secondary winding 274, FIG. 2) may cease, and substantially all remaining energy may be discharged to ground through the discharge switch. The method may then end.

Referring again to block 306, when a magnitude of the commanded voltage level is non-zero, then a determination may be made, in block 312, whether the commanded voltage has a positive polarity or a negative polarity. In an embodiment, this determination may be made by evaluating a voltage polarity input, which may form a portion of the voltage level command. When the voltage polarity input indicates a positive voltage polarity, a further determination may be made, in block 314, whether the device driver is configured in a positive voltage mode. In an embodiment, this determination may be made by evaluating configuration signals received from configuration circuitry (e.g., configuration signals 207 from second configuration circuitry 206, FIG. 2). When the device driver is not configured in a positive voltage mode, then the received voltage level command may be disregarded. The method may then proceed to block 308, described previously, and the method may end.

When the device driver is configured in a positive voltage mode, then in block 316, the processing element may alternate the states of transformer switches (e.g., transformer switches 222, 224) and open the discharge switch (e.g., discharge switch 230, FIG. 2), in an embodiment. This may include controlling the transformer switches to produce an alternating current in the primary winding of the transformer. In an embodiment, this includes repeatedly alternating the switch states of the transformer switches between an open state and a closed state. In an embodiment, the processing element alternates the switch states for a first transformer switch (e.g., V+ switch 222, FIG. 2) 180 degrees out of phase from alternating the switch states for a second transformer switch (e.g., V− switch 224, FIG. 2). Accordingly, the first transformer switch is in an open state when the second transformer switch is in a closed state, and vice versa. This results in the generation of an AC transformer output voltage. Block 316 may continue to be performed, in an embodiment, until another voltage level command is received, at which time the process may return to block 302.

Referring again to block 312, when the voltage polarity input indicates a negative voltage polarity, a further determination may be made, in block 318, whether the device driver is configured in a negative voltage mode. In an embodiment, this determination may be made by evaluating configuration signals received from configuration circuitry, as described previously. When the device driver is not configured in a negative voltage mode, then the received voltage level command may be disregarded. The method may then proceed to block 308, described previously, and the method may end.

When the device driver is configured in a negative voltage mode, then the method may proceed to block 316, in which the processing element may alternate the states of transformer switches (e.g., transformer switches 222, 224) and open the discharge switch (e.g., discharge switch 230, FIG. 2), as described previously, to produce an AC transformer output voltage.

Referring again to block 304, when a determination is made that the device driver is configured in POC mode, then a further determination may be made, in block 326, whether the commanded voltage has a positive polarity or a negative polarity. In an embodiment, this determination may be made by evaluating a voltage polarity input, as described previously. When the voltage polarity input indicates a positive voltage polarity, a further determination may be made, in block 328, whether the device driver is configured in a positive voltage mode. In an embodiment, this determination may be made by evaluating configuration signals received from configuration circuitry, as also described previously. When the device driver is not configured in a positive voltage mode, then the received voltage level command may be disregarded. The method may then proceed to block 308, and the method may end.

When the device driver is configured in a positive voltage mode, then the processing element may wait for an enable command, in block 330, if one is not already present. As described previously, an enable command may be provided to a processing element by a POC enable element (e.g., POC enable element 208, FIG. 2), based on a differential input signal. Once an enable command is present, then in block 332, the processing element may alternate the states of transformer switches (e.g., transformer switches 222, 224) and open the discharge switch (e.g., discharge switch 230, FIG. 2), as described previously, to produce an AC transformer output voltage.

Referring again to block 326, when a determination is made that the voltage polarity input indicates a negative voltage polarity, a further determination may be made, in block 340, whether the device driver is configured in a negative voltage mode. In an embodiment, this determination may be made by evaluating configuration signals received from configuration circuitry, as also described previously. When the device driver is not configured in a negative voltage mode, then the received voltage level command may be disregarded. The method may then proceed to block 308, and the method may end. When the device driver is configured in a negative voltage mode, then the processing element may wait for an enable command, in block 330, if one is not already present. Once an enable command is present, then in block 332, the processing element may alternate the states of transformer switches (e.g., transformer switches 222, 224) and open the discharge switch (e.g., discharge switch 230, FIG. 2), as described previously, to produce an AC transformer output voltage.

After completion of block 332, then in block 350, the processing element may wait until a disable command is present. As with the enable command, described above, a disable command may be provided to the processing element by the POC enable element, based on the differential input signal. When a disable command is not present, the method continues to iterate, as shown. When a determination is made that the disable command is present, the method may then proceed to block 308, in which the transformer switches are opened and the discharge switch is closed, and the method may end.

The sequence of processes illustrated in the flowchart of FIG. 3 represents just one embodiment of a process sequence.

In other embodiments, the sequence of processes depicted in the flowchart of FIG. 3 may be performed in different orders, and/or some processes may be performed in parallel with other processes. Variations in the sequence of processes are intended to be included within the scope of the inventive subject matter.

Analysis of the flowchart of FIG. 3 indicates differences in operation based on whether a device driver is configured in POC mode or EOD mode, and also whether the device driver is configured to generate a positive output voltage or a negative output voltage. For example, when a device driver is configured in EOD mode, the device driver promptly generates a driver output voltage upon receipt of a non-zero voltage level command. The device driver will continue to generate the driver output voltage at the commanded voltage level until another voltage level command is received, which has a different commanded voltage. The device driver may discontinue generation of a driver output voltage upon receipt of a voltage level command specifying a voltage level of zero volts. In contrast, when a device driver is configured in POC mode, the device driver may receive a voltage level command, but the device driver will not generate a corresponding driver output voltage until an enable command is present. In addition, the device driver will not discontinue generation of the driver output voltage until a disable command is present.

Various embodiments of optical systems, device drivers, and methods of operating a device driver processing element have been described herein. An embodiment includes a controllable voltage device driver adapted to generate a driver output voltage. The device driver includes a DC voltage source adapted to receive a voltage level command that indicates a commanded voltage, and to generate a DC transformer input voltage having a voltage level corresponding to the commanded voltage. The device driver also includes a step-up transformer, having a primary winding electrically coupled to the DC voltage source, wherein the transformer is adapted to receive the DC transformer input voltage and to convert the DC transformer input voltage into an AC transformer output voltage. The device driver also includes at least one processing element, adapted to receive one or more control inputs, and to generate an alternating current through the primary winding based on the one or more control inputs. In an embodiment, the step-up transformer is adapted to generate transformer output voltages having magnitudes in a range of zero volts up to about 4000 volts.

In an embodiment, the DC voltage source includes a DAC adapted to receive the voltage level command and to convert the voltage level command into a DC voltage signal, and an operational amplifier, electrically coupled to the DAC, and adapted to generate the DC input voltage based on the DC voltage signal. In an embodiment, the DC voltage source also includes configuration circuitry, electrically coupled to the digital-to-analog converter, where the configuration circuitry is adapted to receive the DC voltage signal, and based on the DC voltage signal, to generate a differential input signal to the operational amplifier which has a first polarity when the device driver is configured in a positive voltage mode, and which has a second polarity when the device driver is configured in a negative voltage mode. In an embodiment, the DC voltage source is electrically coupled to a central tap of the primary winding, and the device driver also includes a first transformer switch, electrically coupled to a first segment of the primary winding, and a second transformer switch, electrically coupled to a second segment of the primary winding, where the at least one processor is further adapted to cause the device driver to the generate the alternating current through the primary winding by alternatively switching states of the first transformer switch and the second transformer switch.

In an embodiment, the device driver also includes a rectifier, electrically coupled to the step-up transformer, and adapted to rectify the AC transformer output voltage to generate the driver output voltage. In an embodiment, the device driver also includes configuration circuitry, electrically coupled to the at least one processing element, where the configuration circuitry is modifiable to configure the device driver in a positive voltage mode, in which the device driver is adapted to generate the driver output voltage when a voltage polarity input indicates a positive voltage polarity for the driver output voltage, or to configure the device driver in a negative voltage mode, in which the device is adapted to generate the driver output voltage when the voltage polarity input indicates a negative voltage polarity for the driver output voltage.

In an embodiment, the device driver also includes a discharge switch, electrically coupled to an output of the device driver, where the at least one processing element is further adapted to close the discharge switch to discharge energy from a secondary winding of the step-up transformer when the device driver is configured in a positive voltage mode and a voltage polarity input indicates a negative voltage polarity, or when the device driver is configured in a negative voltage mode and the voltage polarity input indicates a positive voltage polarity. In an embodiment, the discharge switch includes an insulated gate bipolar transistor.

In an embodiment, the device driver includes configuration circuitry, electrically coupled to the at least one processing element, where the configuration circuitry is modifiable to configure the device driver to operate in a Pockels cell mode or in an electro-optical deflector mode, where the at least one processing element is further adapted to receive the voltage level command, and when the device driver is configured in the electro-optical deflector mode, to cause the device driver to produce the driver output voltage in response to receiving the voltage level command, and when the device driver is configured in the Pockels cell mode, to cause the device driver to wait until an enable command is received before causing the device driver to produce the driver output voltage.

Another embodiment includes an optical system having an electro-optical device and an electro-optical device driver subsystem. The electro-optical device driver subsystem is adapted to generate a driver output voltage across the electro-optical device, and includes at least one electro-optical device driver, such as the controllable voltage device driver described earlier in this paragraph. A method for a controllable voltage device driver to generate a driver output voltage, includes the steps of receiving a voltage level command, which indicates a commanded voltage level for the driver output voltage and, in response to receiving the voltage level command, alternating the switch states of a first transformer switch and a second transformer switch, which are electrically coupled to a primary winding of a step-up transformer, to generate an alternating current transformer output voltage across a secondary winding of the step-up transformer. The method also includes the step of rectifying the alternating current transformer output voltage to generate the driver output voltage.

Embodiments of the inventive subject matter may provide certain advantages over traditional device drivers. For example, device drivers of various embodiments are configurable to function in a POC mode or an EOD mode, whereas traditional device drivers function in one mode or the other, but do not include circuitry to enable them to be configured in a different mode. In addition, device drivers of various embodiments are configurable to generate or to refrain from generating a driver output voltage based on whether a voltage polarity input indicates that a commanded voltage has a positive polarity or a negative polarity.

Further, device drivers of various embodiments are adapted to generate driver output voltages using inductive or magnetic means (e.g., transformer 220, FIG. 2), whereas traditional device drivers generate driver output voltages by charging and discharging capacitive elements. When a traditional device driver is removed from an optical system, excess energy may remain in the capacitive elements, which provides a risk that the excess energy may be discharged into an unintended load. Conversely, no excess energy is retained in a device driver of an example embodiment. Accordingly, a risk that the device driver may discharge excess energy into an unintended load is substantially reduced. In addition, generation of driver output voltages using inductive or magnetic means, in accordance with various embodiments, may adapt a device driver to switch output voltage levels, switch output voltage polarities, and/or turn the output voltage on or off at switching rates (e.g., rates up to or exceeding 20 kilohertz) that are significantly higher than rates achievable by device drivers that include capacitive elements. Further, traditional device drivers generate and regulate relatively high voltages at times when a driver output voltage is not commanded. In contrast, embodiments of the inventive subject matter generate driver output voltages on a command-by-command basis. Accordingly, device drivers, in accordance with various embodiments, may be more energy efficient than their traditional counterparts.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the described embodiments in any way. Rather, the foregoing detailed description will provide those skilled in the art with a convenient road map for implementing the exemplary embodiment or exemplary embodiments. It should be understood that various changes can be made in the function and arrangement of elements without departing from the scope as set forth in the appended claims and the legal equivalents thereof.

What is claimed is:

1. A controllable voltage device driver adapted to generate a driver output voltage, the device driver comprising:
   a direct current voltage source adapted to receive a voltage level command that indicates a commanded voltage, and to generate a direct current transformer input voltage having a voltage level corresponding to the commanded voltage;
   a step-up transformer, having a primary winding electrically coupled to the direct current voltage source, wherein the transformer is adapted to receive the direct current transformer input voltage and to convert the direct current transformer input voltage into an alternating current transformer output voltage; and
   at least one processing element, adapted to receive one or more control inputs, and to generate an alternating current through the primary winding based on the one or more control inputs.

2. The device driver of claim 1, wherein the direct current voltage source comprises:
   a digital-to-analog converter adapted to receive the voltage level command and to convert the voltage level command into a direct current voltage signal; and
   an operational amplifier, electrically coupled to the digital-to-analog converter, and adapted to generate the direct current input voltage based on the direct current voltage signal.

3. The device driver of claim 2, wherein the direct current voltage source further comprises:
   configuration circuitry, electrically coupled to the digital-to-analog converter, wherein the configuration circuitry is adapted to receive the direct current voltage signal, and based on the direct current voltage signal, to generate a differential input signal to the operational amplifier which has a first polarity when the device driver is configured in a positive voltage mode, and which has a second polarity when the device driver is configured in a negative voltage mode.

4. The device driver of claim 1, further comprising:
   a rectifier, electrically coupled to the step-up transformer, and adapted to rectify the alternating current transformer output voltage to generate the driver output voltage.

5. The device driver of claim 1, wherein the direct current voltage source is electrically coupled to a central tap of the primary winding, and wherein the device driver further comprises:
   a first transformer switch, electrically coupled to a first segment of the primary winding; and
   a second transformer switch, electrically coupled to a second segment of the primary winding,
   wherein the at least one processing element is further adapted to cause the device driver to generate the alternating current through the primary winding by alternatively switching states of the first transformer switch and the second transformer switch.

6. The device driver of claim 1, further comprising:
   configuration circuitry, electrically coupled to the at least one processing element, wherein the configuration circuitry is modifiable to configure the device driver in a positive voltage mode, in which the device driver is adapted to generate the driver output voltage when a voltage polarity input indicates a positive voltage polarity for the driver output voltage, or to configure the device driver in a negative voltage mode, in which the device is adapted to generate the driver output voltage when the voltage polarity input indicates a negative voltage polarity for the driver output voltage.

7. The device driver of claim 1, further comprising:
   a discharge switch, electrically coupled to an output of the device driver, wherein the at least one processing element is further adapted to close the discharge switch to discharge energy from a secondary winding of the step-up transformer when the device driver is configured in a positive voltage mode and a voltage polarity input indicates a negative voltage polarity, or when the device driver is configured in a negative voltage mode and the voltage polarity input indicates a positive voltage polarity.

8. The device driver of claim 7, wherein the discharge switch comprises:
   an insulated gate bipolar transistor.

9. The device driver of claim 1, further comprising:
   configuration circuitry, electrically coupled to the at least one processing element, wherein the configuration circuitry is modifiable to configure the device driver to operate in a Pockels cell mode or in an electro-optical deflector mode, wherein the at least one processing element is further adapted to receive the voltage level command, and when the device driver is configured in the electro-optical deflector mode, to cause the device driver to produce the driver output voltage in response to receiving the voltage level command, and when the device driver is configured in the Pockels cell mode, to cause the device driver to wait until an enable command is received before causing the device driver to produce the driver output voltage.

10. The device driver of claim 1, wherein the step-up transformer is adapted to generate transformer output voltages having magnitudes in a range of zero volts up to about 4000 volts.

11. An optical system comprising:

an electro-optical device; and an electro-optical device driver subsystem adapted to generate a driver output voltage across the electro-optical device, wherein the electro-optical device drive subsystem includes at least one electro-optical device driver, and the at least one electro- optical device driver includes a direct current voltage source adapted to receive a voltage level command that indicates a commanded voltage, and to generate a direct current transformer input voltage having a voltage level corresponding to the commanded voltage, a step-up transformer, having a primary winding electrically coupled to the direct current voltage source, wherein the transformer is adapted to receive the direct current transformer input voltage and to convert the direct current transformer input voltage into an alternating current transformer output voltage, and at least one processing element, adapted to receive one or more control inputs, and to generate an alternating current through the primary winding based on the one or more control inputs.

12. The optical system of claim 11, wherein the electro-optical device driver subsystem comprises:

a first device driver configured as a positive voltage driver; and a second device driver, coupled to the first device driver and configured as a negative device driver, wherein the first device driver is adapted to generate the driver output voltage upon receipt of a first control input specifying a positive output voltage, and wherein the second device driver is adapted to generate the driver output voltage upon receipt of a second control input specifying a negative output voltage.

13. The optical system of claim 11, further comprising:

a controller, electrically coupled to the electro-optical device driver subsystem, and adapted to generate the control inputs.

14. The optical system of claim 11, wherein the electro-optical device includes at least one crystal selected from a group of crystals that includes lithium niobate, lithium tantalate, potassium dihydrogen phosphate, ammonium dihydrogen phosphate, potassium dideuterium phosphate, barium sodium niobate, and cadmium telluride.

15. The optical system of claim 11, further comprising:

a first electrode, electrically coupled to the electro-optical device driver subsystem and to the electro-optical device; and a second electrode, electrically coupled to the electro-optical device driver subsystem and to the electro-optical device, wherein the first electrode and the second electrode are oriented, with respect to the electro-optical device, to generate a first voltage parallel to a direction of light propagation.

16. The optical system of claim 11, further comprising:

a first electrode, electrically coupled to the electro-optical device driver subsystem and to the electro-optical device; and a second electrode, electrically coupled to the electro-optical device driver subsystem and to the electro-optical device, wherein the first electrode and the second electrode are oriented, with respect to the electro-optical device, to generate a second voltage perpendicular to a direction of light propagation.

17. A method for a controllable voltage device driver to generate a driver output voltage, the method comprising the steps of:

receiving a voltage level command, which indicates a commanded voltage level for the driver output voltage;

in response to receiving the voltage level command, alternating a switch state of a first transformer switch and a second transformer switch, which are electrically coupled to a primary winding of a step-up transformer, to generate an alternating current transformer output voltage across a secondary winding of the step-up transformer; and rectifying the alternating current transformer output voltage to generate the driver output voltage.

18. The method of claim 17, further comprising:

determining whether the controllable voltage device driver is configured in a Pockels cell mode or in an electro-optic deflector mode; and when the controllable voltage device driver is configured in the Pockels cell mode, waiting to alternate the switch state of the first transformer switch and the second transformer switch until an enable command is received.

19. The method of claim 17, further comprising:

determining whether the controllable voltage device driver is configured in a positive voltage mode or in a negative voltage mode;

determining whether a voltage polarity input indicates a positive polarity output voltage or a negative polarity output voltage;

when the controllable voltage device driver is configured in the positive voltage mode and the polarity input indicates the negative polarity output voltage, opening the first transformer switch and the second transformer switch, and closing a discharge switch to enable energy within the transformer to be discharged to ground; and when the controllable voltage device driver is configured in the negative voltage mode and the polarity input indicates the positive polarity output voltage, opening the first transformer switch and the second transformer switch, and closing the discharge switch.

* * * * *